United States Patent
Han et al.

(10) Patent No.: US 11,276,987 B2
(45) Date of Patent: Mar. 15, 2022

(54) VERTICAL CAVITY SURFACE-EMITTING LASER INCLUDING NANOSTRUCTURE REFLECTOR AND OPTICAL APPARATUS USING THE VERTICAL CAVITY SURFACE-EMITTING LASER

(71) Applicant: SAMSUNG ELECTRONICS CO., LTD., Suwon-si (KR)

(72) Inventors: Seunghoon Han, Seoul (KR); Byunghoon Na, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 36 days.

(21) Appl. No.: 16/248,276

(22) Filed: Jan. 15, 2019

(65) Prior Publication Data

US 2020/0076163 A1    Mar. 5, 2020

(30) Foreign Application Priority Data

Sep. 4, 2018  (KR) .......................... 10-2018-0105310

(51) Int. Cl.
*H01S 5/183*       (2006.01)
*H01S 5/42*        (2006.01)

(52) U.S. Cl.
CPC ...... *H01S 5/18361* (2013.01); *H01S 5/18308* (2013.01); *H01S 5/18355* (2013.01); *H01S 5/18391* (2013.01); *H01S 5/423* (2013.01); *H01S 2301/14* (2013.01)

(58) Field of Classification Search
CPC .. H01S 5/18361–1838; H01S 5/18386–18394; H01S 5/18355; H01S 2301/14; H01S 2301/145
See application file for complete search history.

(56) References Cited

U.S. PATENT DOCUMENTS

| | | | |
|---|---|---|---|
| 1,015,669 A * | 1/1912 | Elmore | B61L 11/02 246/356 |
| 6,055,262 A | 4/2000 | Cox et al. | |
| 7,570,427 B2 * | 8/2009 | Hasman | G02B 5/1809 359/485.01 |
| 2007/0230529 A1 | 10/2007 | Mochizuki | |
| 2012/0093189 A1 * | 4/2012 | Fattal | B82Y 20/00 372/50.11 |
| 2012/0128019 A1 * | 5/2012 | Chang-Hasnain | H01S 5/423 372/45.01 |

(Continued)

FOREIGN PATENT DOCUMENTS

KR    10-1996-0039507 A    11/1996

*Primary Examiner* — Tod T Van Roy
(74) *Attorney, Agent, or Firm* — Sughrue Mion, PLLC

(57) ABSTRACT

Vertical cavity surface-emitting lasers (VCSELs) includes a vertical cavity surface-emitting laser including a gain layer configured to generate light, a distributed Bragg reflector disposed on a first surface of the gain layer, and a nanostructure reflector disposed on a second surface of the gain layer opposite from the first surface, the nanostructure reflector including a plurality of nanostructures having a sub-wavelength dimension, wherein the plurality of nanostructures include a plurality of anisotropic nanoelements and are configured to emit a circularly polarized laser light through the nanostructure reflector based on distributions and arrangement directions of the plurality of anisotropic nanoelementss.

17 Claims, 11 Drawing Sheets

(56) References Cited

U.S. PATENT DOCUMENTS

| | | | |
|---|---|---|---|
| 2016/0025914 A1* | 1/2016 | Brongersma | G02B 1/002 359/489.07 |
| 2017/0010466 A1* | 1/2017 | Klug | G02B 27/0172 |
| 2018/0278023 A1 | 9/2018 | Na et al. | |

* cited by examiner

VERTICAL CAVITY SURFACE-EMITTING LASER INCLUDING NANOSTRUCTURE REFLECTOR AND OPTICAL APPARATUS USING THE VERTICAL CAVITY SURFACE-EMITTING LASER

CROSS-REFERENCE TO RELATED APPLICATION

This application claims priority from Korean Patent Application No. 10-2018-0105310, filed on Sep. 4, 2018 in the Korean Intellectual Property Office, the disclosure of which is incorporated herein in its entirety by reference.

BACKGROUND

1. Field

One or more example embodiments of the present disclosure relate to vertical cavity surface-emitting lasers including nanostructure reflectors, and optical apparatuses using the vertical cavity surface-emitting lasers.

2. Description of the Related Art

A vertical cavity surface emitting laser (VCSEL) has a shorter gain length compared to an edge emitting laser (EEL) which may reduce power consumption thereof. A VCSEL may be fabricated in a two-dimensional array due to vertical emission of light, which is advantageous for high-density integration and mass production. While an EEL has asymmetrical optical output, the VCSEL provides a circular symmetrical output mode, such that the VCSEL may have a more stable high-speed modulation with low noise by efficient connection to an optical fiber.

The VCSEL includes a distributed Bragg reflector (DBR) having a relatively high reflexibility of about 98% or more to constitute a laser resonator. The DBR including pairs of two materials with different refractive indices usually requires several tens of pairs of laminated structures to obtain a high reflexibility. In addition, the DBR has a relatively low thermal conductivity or a relatively high thermal resistance due to phonon scattering occurring at a boundary of two materials. A technique and a method capable of improving light control and light emission characteristics are needed while compensating for disadvantages of the DBR.

SUMMARY

One or more example embodiments provide vertical cavity surface-emitting lasers capable of improving light emission characteristics and light control characteristics.

One or more example embodiments provide vertical cavity surface-emitting lasers including a nanostructure reflector having a dimension of a subwavelength.

One or more example embodiments provide optical apparatuses using the vertical cavity surface-emitting lasers described above.

Additional aspects will be set forth in part in the description which follows and, in part, will be apparent from the description, or may be learned by practice of example embodiments.

According to an aspect of an example embodiment, there is provided a vertical cavity surface-emitting laser including a gain layer configured to generate light, a distributed Bragg reflector disposed on a first surface of the gain layer, and a nanostructure reflector disposed on a second surface of the gain layer opposite from the first surface, the nanostructure reflector including a plurality of nanostructures having a sub-wavelength dimension, wherein the plurality of nanostructures include a plurality of anisotropic nanoelements and are configured to emit a circularly polarized laser light through the nanostructure reflector based on distributions and arrangement directions of the plurality of anisotropic nanoelements.

The vertical cavity surface-emitting laser, wherein an arrangement direction of each of the plurality of anisotropic nanoelements may change from a central portion of the nanostructure reflector to an edge of the nanostructure reflector.

The plurality of nanostructures may be further configured to emit a right-handed circularly polarized laser light or a left-handed circularly polarized laser light based on the distributions and the arrangement directions of the plurality of anisotropic nanoelements.

The plurality of anisotropic nanoelements may have a thickness of ½ or less of an oscillation wavelength $\lambda$ of the circularly polarized laser light.

The plurality of anisotropic nanoelements may have an arrangement interval of ½ or less of an oscillation wavelength $\lambda$ of the circularly polarized laser light.

The vertical cavity surface-emitting laser, wherein a size distribution and an arrangement rule of the plurality of anisotropic nanoelements may be determined such that the nanostructure reflector is configured to act as a concave mirror with respect to the gain layer.

The vertical cavity surface-emitting laser, wherein a width of the plurality of anisotropic nanoelements may increase as a distance from a central portion of the nanostructure reflector increases.

The nanostructure reflector may include a plurality of regions based on a distance in a radial direction away from a central portion of the nanostructure reflector, and a width of the plurality of anisotropic nanoelements included in each of the plurality of regions may increase as a distance from the central portion of the nanostructure reflector increases.

The nanostructure reflector may be divided into a plurality of regions based on a distance in a radial direction away from a central portion of the nanostructure reflector, wherein the plurality of regions may include a first region and a second region, and wherein an average value of widths of the plurality of anisotropic nanoelements included in the first region and an average value of widths of the plurality of anisotropic nanoelements included in the second region are different from each other.

The nanostructure reflector may further include a support layer, the support layer having a thickness of ⅕ or more of an oscillation wavelength $\lambda$ of the circularly polarized laser light, and the plurality of anisotropic nanoelements may be disposed on the support layer.

The vertical cavity surface-emitting laser, wherein a refractive index of the support layer may be lower than a refractive index of the plurality of anisotropic nanoelements.

The vertical cavity surface-emitting laser, wherein a reflectance of the distributed Bragg reflector may be greater than a reflectance of the nanostructure reflector.

The gain layer may include a first clad layer, a second clad layer, and an active layer disposed between the first clad layer and the second clad layer.

The vertical cavity surface-emitting laser, wherein at least one of the active layer, the first clad layer, and the second clad layer may include a III-V semiconductor material or a II-VI semiconductor material.

According to another aspect of an example embodiment, there is provided an optical apparatus including a vertical cavity surface-emitting laser including a gain layer configured to generate light, a distributed Bragg reflector disposed on a first surface of the gain layer, and a nanostructure reflector disposed on a second surface of the gain layer opposite from the first surface, the nanostructure reflector including a plurality of nanostructures having a sub-wavelength dimension, wherein the plurality of nanostructures include a plurality of anisotropic nanoelements and are configured to emit a circularly polarized laser light through the nanostructure reflector based on distributions and arrangement directions of the plurality of anisotropic nanoelements.

The optical apparatus may further include a first vertical cavity surface-emitting laser and a second vertical cavity surface-emitting laser, wherein the first vertical cavity surface-emitting laser includes a plurality of first nanostructures having a first arrangement and is configured to emit a first circularly polarized laser light, and the second vertical cavity surface-emitting laser includes a plurality of second nanostructures having a second arrangement and is configured to emit a second light light.

The optical apparatus, wherein one of the first circularly polarized laser light and the second circularly polarized laser light may be a right-handed circularly polarized laser light, and the other may be a left-handed circularly polarized laser light.

The optical apparatus may further include an array of a plurality of first vertical cavity surface-emitting lasers and a plurality of second vertical cavity surface-emitting lasers.

The optical apparatus may further include at least one of a three-dimensional imaging apparatus, a three-dimensional projector, a three-dimensional sensor, and a depth sensor.

The vertical cavity surface-emitting laser, wherein an average value of widths of the plurality of anisotropic nanoelements included in each of the plurality of regions may be equal.

BRIEF DESCRIPTION OF THE DRAWINGS

The above and/or other aspects will become apparent and more readily appreciated from the following description of example embodiments, taken in conjunction with the accompanying drawings in which.

DETAILED DESCRIPTION

Figure 1:
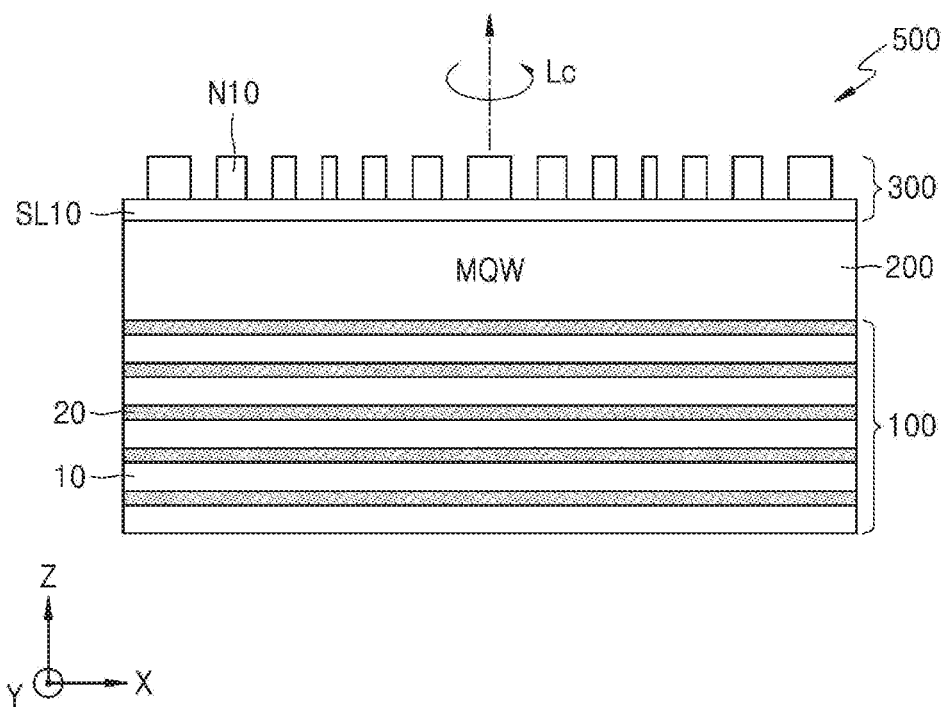
FIG. 1 is a cross-sectional view of a vertical cavity surface-emitting laser (VCSEL) including a nanostructure reflector according to an example embodiment.

Reference will now be made in detail to example embodiments, examples of which are illustrated in the accompanying drawings, wherein like reference numerals refer to like elements throughout. In this regard, example embodiments may have different forms and should not be construed as being limited to the descriptions set forth herein. Accordingly, example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing an example embodiments only and is not intended to be limiting. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms including technical and scientific terms used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, vertical cavity surface-emitting lasers (VCSELs) including nanostructure reflectors and optical apparatuses using the VCSELs will now be described in detail with reference to the accompanying drawings. Widths and thicknesses of layers or regions illustrated in the accompanying drawings may be exaggerated for clarity of the disclosure and convenience of explanation. Like reference numerals indicate like elements throughout the disclosure.

FIG. 1 is a cross-sectional view of a VCSEL 500 including a nanostructure reflector 300 according to an example embodiment.

Referring to FIG. 1, the VCSEL 500 may include a gain layer 200 generating light, a distributed Bragg reflector (DBR) 100 arranged on a first surface, e.g., a lower surface, of the gain layer 200, and the nanostructure reflector 300 arranged on a second surface, e.g., an upper surface, opposite to the first surface, of the gain layer 200. The nanostructure reflector 300 may include a plurality of nanostructures N10 having a shape dimension of a subwavelength. The plurality of nanostructures N10 may be a plurality of anisotropic nanoelements or may include a plurality of anisotropic nanoelements. Anisotropic nanoelements may be a nanostructure having an anisotropic characteristic according to a direction, such as a rectangle or an ellipse, as opposed to an element having a same directionality, isotropy, in all directions, such as a circle or a square. In view of above, the plurality of nanostructures N10 may have a rectangular shape, an oval shape, or an anisotropic shape similar thereto. The VCSEL 500 according to the example embodiment may emit a circularly polarized laser light Lc through the nanostructure reflector 300 by distributions and arrangement directions of the plurality of nanostructures N10.

The gain layer 200 is a layer that absorbs energy to generate light. The gain layer 200 may generate light, for example, by current injection or pumping light. The gain layer 200 may include an active layer which includes a semiconductor material. The active layer may include, for example, a III-V semiconductor material or a II-VI semiconductor material. For example, the active layer may include a multi-quantum well (MQW) structure including indium gallium arsenide (InGaAs), aluminum gallium arsenide (AlGaAs), aluminum gallium nitride (AlGaN), indium gallium arsenide phosphide (InGaAsP), indium gallium phosphide (InGaP), or aluminum gallium indium phosphide (AlGaInP). In addition, the active layer may include a quantum dot. A material and a structure of the active layer are not limited to those illustrated and may vary.

The distributed Bragg reflector 100 arranged on the first surface (lower surface) of the gain layer 200 and the nanostructure reflector 300 arranged on the second surface (upper surface) of the gain layer 200 may resonate light generated in the gain layer 200 and amplify the light of a wavelength band to output the light. For example, reflexibilities of the distributed Bragg reflector 100 and the nanostructure reflector 300 may be set to about 90% or more. The reflectance (reflexibility) of the distributed Bragg reflector 100 may be made greater than the reflectance (reflexibility) of the nanostructure reflector 300. For example, the reflectance of the distributed Bragg reflector 100 may be set to about 98% or more such that light may be emitted through the nanostructure reflector 300. A wavelength $\lambda$ of the circularly polarized laser light Lc may be an oscillation wavelength $\lambda$, i.e., lasing wavelength or emitting wavelength, the circularly polarized laser light Lc being light Lc oscillated and emitted between the distributed Bragg reflector 100 and the nanostructure reflector 300. According to example embodiments, the reflexibilities of the distributed Bragg reflector 100 and the nanostructure reflector 300 may be adjusted such that a direction in which light is emitted is reversed.

The distributed Bragg reflector 100 may be formed by alternately and repeatedly stacking a first material layer 10 and a second material layer 20 to a thickness of about ¼ of the desired oscillation wavelength, the first material layer 10 and the second material layer 20 having different refractive indexes from each other. The distributed Bragg reflector 100 may be formed above a semiconductor substrate. The reflectance of the distributed Bragg reflector 100 may be set to a desired value by adjusting a refractive index difference between the first material layer 10 and the second material layer 20, and adjusting the number of times of repeatedly stacking the first material layer 10 and the second material layer 20. The distributed Bragg reflector 100 may be formed to include a series of materials which are the same as or similar to the semiconductor material constituting the gain layer 200. For example, the first material layer 10 may include an $Al_xGa_{(1-x)}As$ layer, wherein x is 0≤x≤1, and the second material layer 20 may include an $Al_yGa_{(1-y)}As$ layer, wherein y is 0≤y≤1, x≠y. However, the material layers may not be limited thereto and the materials may be different. Various materials capable of forming a refractive index difference may be used for the first material layer 10 and the second material layer 20.

The nanostructure reflector 300 includes the plurality of nanostructures N10 having a shape dimension of a subwavelength, where a thickness or a width, which is a dimension to define a shape of the nanostructure N10, is less than an operating wavelength of the nanostructure reflector 300. The operating wavelength of the nanostructure reflector 300 may be within a wavelength band of light generated in the gain layer 200 and indicate light Lc oscillated and emitted between the distributed Bragg reflector 100 and the nanostructure reflector 300 in the light generated in the gain layer 200, the light Lc being the wavelength of the circularly polarized laser light Lc, i.e., the oscillation wavelength λ.

The plurality of nanostructures N10 may include a material having a refractive index higher than that of a surrounding material, e.g., air, and may reflect light of a predetermined wavelength band by shape dimensions of the subwavelength, particular shapes, and arrangement forms. The plurality of nanostructures N10 may constitute a type of meta-structure. At least one of a thickness, width, and arrangement pitch of the nanostructure N10 may be ½ or less of the oscillation wavelength λ. When the width of the nanostructure N10 is ½ or less of the oscillation wavelength λ, the nanostructure N10 may operate as a stronger scattering unit having a meta-structure, and control the incident light to a desired shape without higher order diffraction as an arrangement interval decreases less than the oscillation wavelength λ. When the thickness of the nanostructure N10 is ½ or less of the oscillation wavelength λ, the nanostructure reflector 300 may operate with a relatively high reflection characteristics. However, a thickness of the nanostructure N10 is not limited thereto.

The plurality of nanostructures N10 may include a dielectric material or a semiconductor material. For example, the nanostructure N10 may include one of a material of single crystal silicon, polycrystalline silicon, an amorphous silicon, silicon nitride ($Si_3N_4$), gallium phosphide (GaP), titanium dioxide ($TiO_2$), aluminum antimonide (AlSb), aluminum arsenide (AlAs), AlGaAs, AlGaInP, boron phosphide (BP), and zinc germanium phosphide ($ZnGeP_2$). According to an example embodiment, the nanostructure N10 may include a conductive material. As the conductive material, a highly conductive material capable of causing surface plasmon excitation may be used. For example, at least one selected from among copper (Cu), aluminum (Al), nickel (Ni), iron (Fe), cobalt (Co), zinc (Zn), titanium (Ti), ruthenium (Ru), rhodium (Rh), palladium (Pd), platinum (Pt), silver (Ag), osmium (Os), iridium (Ir), and gold (Au) may be used and an alloy including any one of them may be included. In addition, a conductive two-dimensional material, such as graphene, or a conductive oxide may be used. According to an example embodiment, some of the plurality of nanostructures N10 may include a dielectric material having a high refractive index, and the rest may include a conductive material.

The nanostructure reflector 300 may further include a support layer SL10 supporting the plurality of nanostructures N10. The support layer SL10 may include a material having a refractive index that is less than the refractive index of the nanostructure N10. For example, the support layer SL10 may include silicon dioxide ($SiO_2$), and a transparent conductive oxide (TCO), or a polymer such as a polycarbonate (PC), polystyrene (PS), and polymethyl methacrylate (PMMA). The material of the support layer SL10 is not limited thereto and may be a semiconductor material. The support layer SL10 and the nanostructure N10 may include a same or similar semiconductor material. For example, the support layer SL10 and the nanostructure N10 may include a III-V semiconductor compound. Further, by controlling a composition ratio of the compound, the refractive index of the support layer SL10 may be made less than the refractive index of the nanostructure N10. The refractive index difference between the support layer SL10 and the nanostructure N10 may be about 0.5 or more.

A thickness of the support layer SL10 may be set to about ⅕ or more of the oscillation wavelength λ. When the thickness of support layer SL10 is less than ⅕ of the oscillation wavelength λ, light resonating in the nanostructure N10 on the support layer SL10 may be coupled to a lower layer of the semiconductor material, and thus the desired operation may not be performed as a meta-structure. When the thickness of the support layer SL10 is thinner than a predetermined value, an unwanted optical coupling may occur between the nanostructure N10 and a structure under the support layer SL10.

The plurality of nanostructures N10 may be a plurality of anisotropic nanoelements or include a plurality of anisotropic nanoelements. The vertical cavity surface-emitting laser 500 may emit a circularly polarized laser light Lc through the nanostructure reflector 300 by a distribution and an arrangement direction of the plurality of anisotropic nanoelements. For example, an arrangement direction of each of the plurality of anisotropic nanoelements may gradually change from a central portion of the nanostructure reflector 300 toward an edge of the nanostructure reflector 300.

Figure 2:
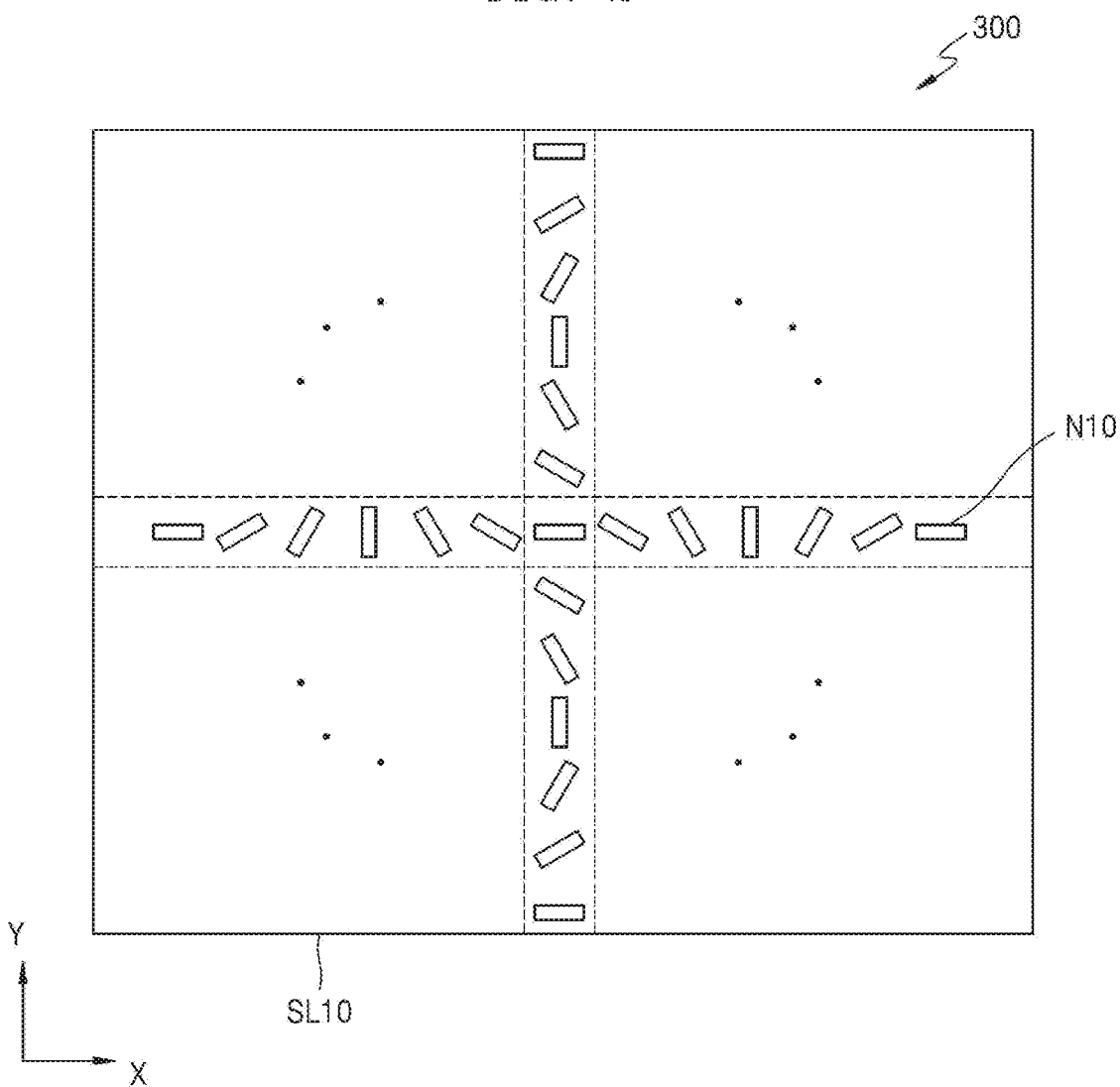
FIG. 2 is a plan view of a planar structure of a nanostructure reflector according to an example embodiment.

FIG. 2 is a plan view of a planar structure of the nanostructure reflector 300 according to an example embodiment.

Referring to FIG. 2, the nanostructure reflector 300 may include the support layer SL10 and the plurality of nanostructures N10 formed above the support layer SL10. The plurality of nanostructures N10 may be a plurality of anisotropic nanoelements. An arrangement direction of each of the plurality of nanostructures N10 may gradually change from the central portion of the nanostructure reflector 300 to the edge of the nanostructure reflector 300. The plurality of nanostructures N10 may have an array direction rotated slightly from the central portion to the edge of the nanostructure reflector 300. For example, FIG. 2 illustrates how the arrangement direction of the nanostructures N10 in a cruciform region may be changed with reference to the central portion of the nanostructure reflector 300. Although the nanostructures N10 are schematically shown as dots in remaining regions other than the cruciform region, the change in the arrangement direction of the nanostructures N10 may have a similar change in the arrangement direction in the remaining regions. However, the change in the arrangement direction of the nanostructures N10 are not limited thereto, and may vary.

Figure 3:
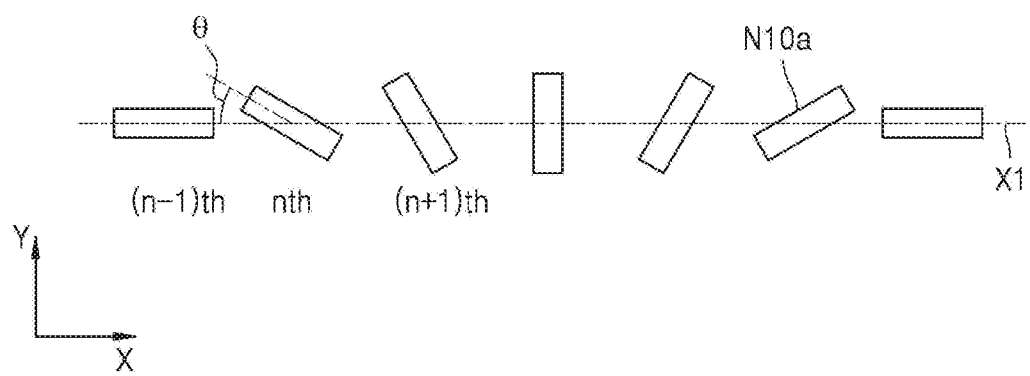
FIG. 3 is a plan view of a portion of a plurality of nanostructures applicable to a nanostructure reflector according to an example embodiment.

FIG. 3 is a plan view of some of the plurality of nanostructures applicable to the nanostructure reflector 300 according to an example embodiment. FIG. 3 may correspond to some of the plurality of nanostructures N10 shown in FIG. 2.

Referring to FIG. 3, a first group of anisotropic nanoelements N10a may be arranged to form one row along a first axis X1 parallel to a plane in which the plurality of nanostructures N10 (in FIG. 2) may be arranged in a row. An n-th nanoelement of the first group of anisotropic nanoelements N10a may have a direction rotated by an angle θ with respect to an (n−1)-th nanoelement. When the (n−1)-th nanoelement has an arrangement direction parallel to the first axis X1, the n-th nanoelement may have a direction rotated by θ with respect to the first axis X1. In addition, an (n+1)-th nanoelement may have a direction rotated by an angle θ with respect to the n-th nanoelement. The (n−1)th nanoelement may correspond to a nanostructure located at the central portion of the nanostructure reflector 300 in FIG. 2. As described above, the arrangement direction of the plurality of nanostructures N10 may gradually change from the central portion of the nanostructure reflector 300 to the edge of the nanostructure reflector 300.

The θ may be less than about 45 degrees or less than about 35 degrees. A size of the θ may be appropriately controlled in accordance with conditions such as wavelength, polarization, and phase of light incident on the nanostructure reflector 300. Conditions of the above-mentioned θ may be similarly applied to an X-axis direction and a Y-axis direction. However, example embodiments are not limited thereto, and different conditions of the θ may be applied to the X-axis direction and the Y-axis direction. In addition, different conditions of the θ may be applied according to a region of the nanostructure reflector 300. The circularly polarized laser light may be emitted through the nanostructure reflector 300.

As described with reference to FIGS. 1 to 3, the circularly polarized laser light Lc may be emitted by adjusting the distribution and arrangement direction of the plurality of nanostructures N10, that is, the plurality of anisotropic nanoelements, constituting the nanostructure reflector 300. The vertical cavity surface-emitting laser 500 may be configured to emit a right-handed circularly polarized laser light or a left-handed circularly polarized laser light according to the distributions and the arrangement directions of the plurality of nanostructures N10, that is, the plurality of anisotropic nanoelements.

Figure 4:
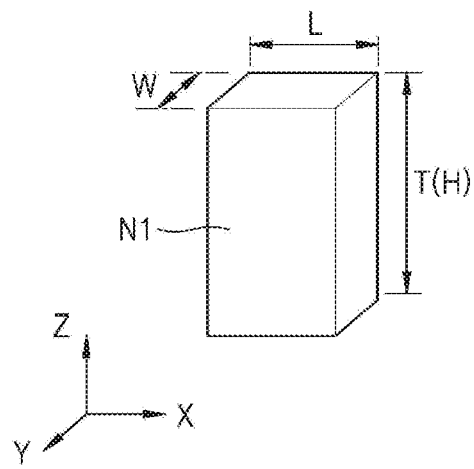
FIG. 4 is a perspective view of a nanostructure applicable to a nanostructure reflector according to an example embodiment.

FIG. 4 is a perspective view of a structure of a nanostructure N1 applicable to a nanostructure reflector according to an example embodiment.

Referring to FIG. 4, the nanostructure N1 may have, on an XY plane, a long axis in a first direction, e.g., an X-axis direction, and a short axis in a second direction, e.g., a Y-axis direction. A dimension of the long axis may be referred to as a length L and a dimension in the short axis direction may be referred to as a width W. A dimension in a Z-axis direction may be a thickness T or a height H. The length L may be greater than the width W. The nanostructure N1 above the XY plane may have a rectangular shape or the like. The nanostructure N1 may have an anisotropic structure.

The width W and the length L and/or the thickness T of the nanostructure N1 may be ½ or less of the oscillation wavelength λ. In addition, when the plurality of nanostructures N1 are regularly arranged, an interval between the centers of the two nanostructures N1, which are adjacent to each other may be ½ or less of the oscillation wavelength λ.

The anisotropic structure of the nanostructure N1 may vary. For example, the nanostructure N1 above the XY plane may have an anisotropic structure other than a rectangular shape. Examples thereof are shown in FIGS. 5 and 6.

Figure 5:
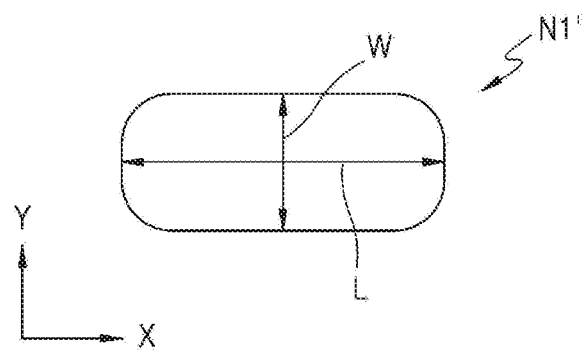
FIG. 5 is a plan view of a nanostructure applicable to a nanostructure reflector according to an example embodiment.

Referring to FIG. 5, a nanostructure N1' may generally have a rectangular shape with rounded corners.

Figure 6:
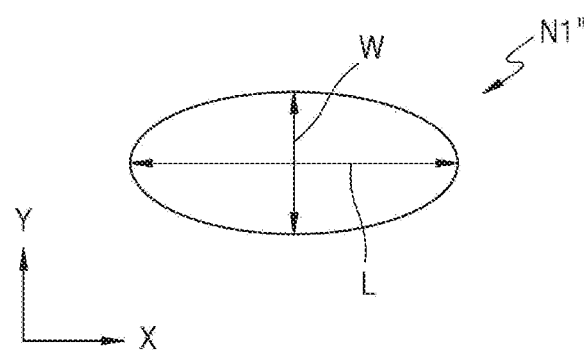
FIG. 6 is a plan view of a nanostructure applicable to a nanostructure reflector according to an example embodiment.

Referring to FIG. 6, the nanostructure N1" may have an oval shape or a similar shape. Shapes of the nanostructures N1, N1', and N1" described with reference to FIGS. 4 to 6 are illustrative and may be variously changed.

Figure 7:
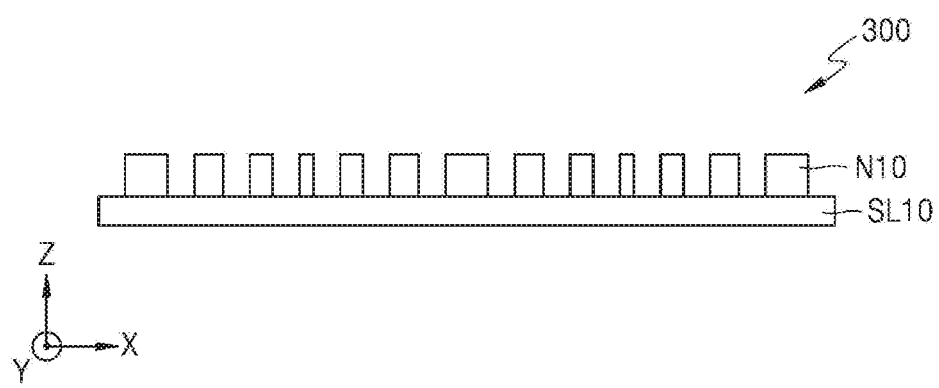
FIG. 7 is a cross-sectional view of a nanostructure reflector applicable to a VCSEL according to an example embodiment.

FIG. 7 is a cross-sectional view of the nanostructure reflector 300 applicable to a VCSEL according to an example embodiment.

Referring to FIG. 7, the nanostructure reflector 300 may include the support layer SL10 and the plurality of nanostructures N10 above the support layer SL10.

Figure 8:
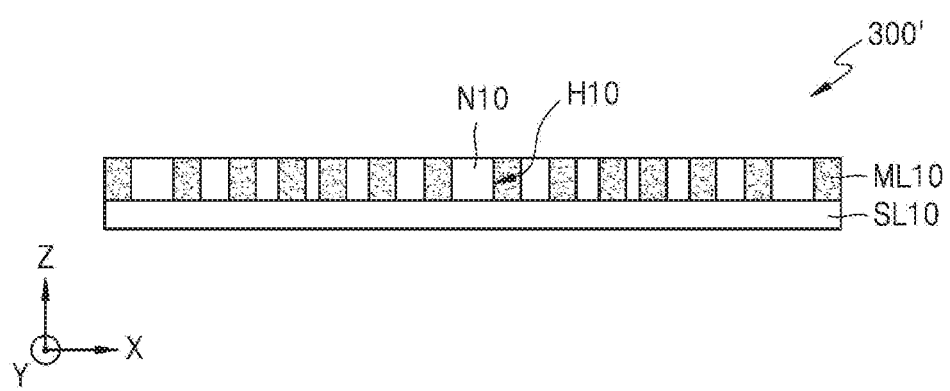
FIG. 8 is a sectional view of a nanostructure reflector applicable to a VCSEL according to an example embodiment.

FIG. 8 is a sectional view of a nanostructure reflector 300' applicable to a VCSEL according to an example embodiment.

Referring to FIG. 8, the nanostructure reflector 300' may further include a predetermined material layer ML10 having a plurality of holes H10 above the support layer SL10. The plurality of nanostructures N10 may be respectively arranged in the plurality of holes H10. A refractive index of the material layer ML10 may be less than the refractive index of the plurality of nanostructures N10. The material layer ML10 may include a different material or a same material as the support layer SL10. The material layer ML10 may be an adjacent layer or a contact layer, since the material layer ML10 may be in contact with a periphery of the plurality of nanostructures N10.

According to example embodiments of the present disclosure, a nanostructure reflector may be configured to act as a concave mirror with respect to a gain layer. A size distribution and an arrangement rule of a plurality of nanostructures (a plurality of anisotropic nanoelements) constituting the nanostructure reflector may be configured such that the nanostructure reflector acts as a concave mirror.

Figure 9:
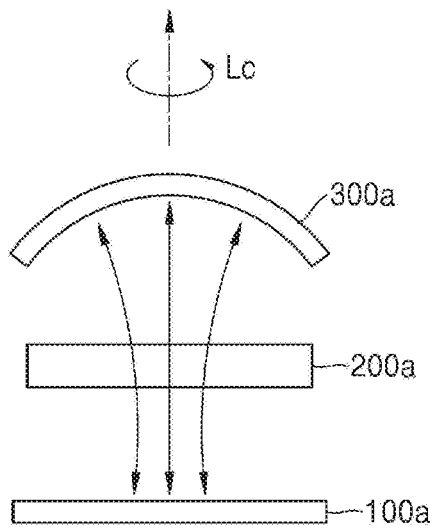
FIG. 9 is a conceptual view schematically showing an optical arrangement relationship of components of a VCSEL when the nanostructure reflector is configured to act as a concave mirror according to an example embodiment.

FIG. 9 is a conceptual view schematically showing an optical arrangement relationship of components of a VCSEL when a nanostructure reflector 300a is configured to act as a concave mirror according to an example embodiment.

Referring to FIG. 9, a distributed Bragg reflector 100a and the nanostructure reflector 300a may be arranged apart from each other with a gain layer 200a therebetween. The distributed Bragg reflector 100a and the nanostructure reflector 300a may form a resonance cavity with the gain layer 200a arranged therebetween. The nanostructure reflector 300a may act as a curved mirror, for example, a concave mirror, with respect to the gain layer 200a. The distributed Bragg reflector 100a may act as a flat plate mirror with respect to the gain layer 200a. When the nanostructure reflector 300a acts as a concave mirror, an intensity of emitted light oscillated from the VCSEL, that is, an intensity of the circularly polarized laser light Lc, may be enhanced and a wavefront profile may be controlled. Optical characteristics of the nanostructure reflector 300a may be controlled by adjusting the size distributions and the arrangement regulations (rules) of the plurality of nanostructures constituting the nanostructure reflector 300a, and as a result, beam forming and beam shaping of the emitted light Lc may be possible.

Figure 10:
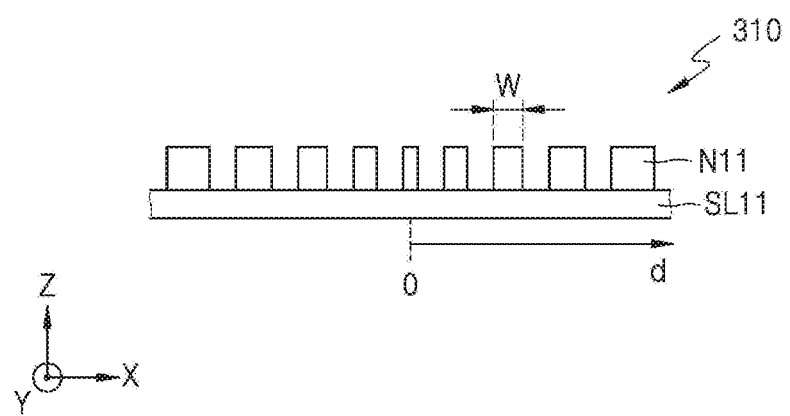
FIG. 10 is a cross-sectional view of a schematic structure of a nanostructure reflector applicable in a VCSEL according to an example embodiment.

FIG. 10 is a cross-sectional view of a schematic structure of a nanostructure reflector 310 applicable in a VCSEL according to an example embodiment.

Referring to FIG. 10, the nanostructure reflector 310 may include a support layer SL11 and a plurality of nanostructures N11 formed above the support layer SL11. The plurality of nanostructures N11 may be a plurality of anisotropic nanoelements. Size distributions and arrangement rules of the nanostructures N11 may be set such that the nanostructure reflector 310 may act as a concave mirror. For example, a width W of the plurality of nanostructures N11 may increase as a distance away from a central portion of the nanostructure reflector 310 increases by a predetermined distance d. When a position of the nanostructure N11 is defined as a distance in a radial direction from a center of the nanostructure reflector 310, the width W of the nanostructure N11 at a given position may be set to a particular value such that the nanostructure reflector 310 operates as a concave mirror. The width W of the nanostructure N11 may increase in the radial direction within a predetermined range from the center of the nanostructure reflector 310. In addition, the arrangement direction of the plurality of nanostructures N11 may gradually change from a central portion to an edge of the nanostructure reflector 310, which may be the same as that described with reference to FIGS. 2 and 3. For convenience, only a tendency of the width W of the nanostructure N11 to change is shown in FIG. 10.

A change in the width W of the nanostructure N11 described in FIG. 10 may be repeated in the radial direction. An example thereof is shown in FIG. 11.

Figure 11:
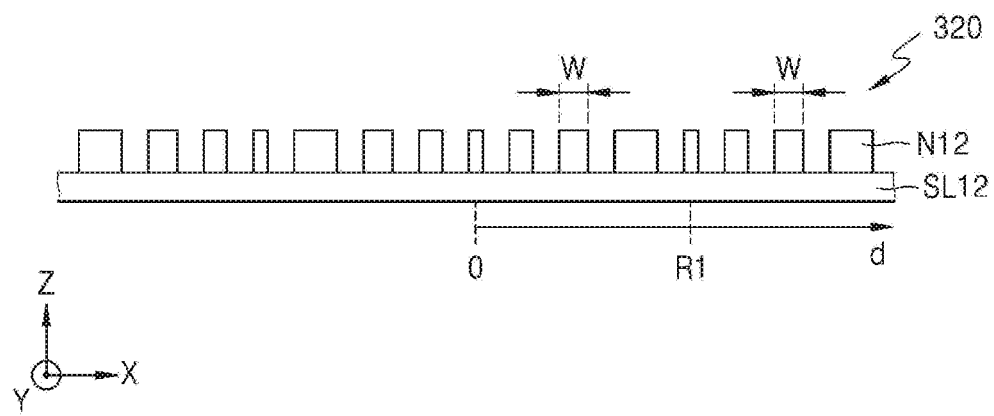
FIG. 11 is a cross-sectional view of a schematic structure of a nanostructure reflector applicable in a VCSEL according to an example embodiment.

Referring to FIG. 11, a nanostructure reflector 320 may include a support layer SL12 and a plurality of nanostructures N12, a width W of the plurality of nanostructures N12 may increase as a distance away from the central portion of the nanostructure reflector 320 increases by a predetermined rule. The nanostructure reflector 320 may be divided into a plurality of regions according to a distance in a direction away from the center, wherein a width of the plurality of nanostructures N12 in each of the plurality of regions increases as a distance away from the center increases. Herein, it is shown that the width W increases from the center (d=0) to an R1 position and the width W increases again as a distance d increases from the R1 position. A period in which a rule of increasing the width W is repeated may not be constant but may be changed. The nanostructure reflector 320 may act as a concave mirror.

The widths W of the nanostructures N11 and N12 in FIGS. 10 and 11 may correspond to the width of nanostructure N1 described with reference to FIG. 4. As the widths of the nanostructures N11 and N12 in FIGS. 10 and 11 change, lengths thereof may also be changed. In some cases, the widths W in FIGS. 10 and 11 may correspond to a length L described in FIG. 4, that is a width in a long-axis direction. An aspect ratio, which is a ratio of the width W and the length L of the nanostructure, may be varied depending on the position of the nanostructure reflector 320. Characteristics of the nanostructure reflectors 310 and 320 may be variously controlled by appropriately adjusting dimensions of the nanostructures N11 and N12 in various ways.

Figure 12:
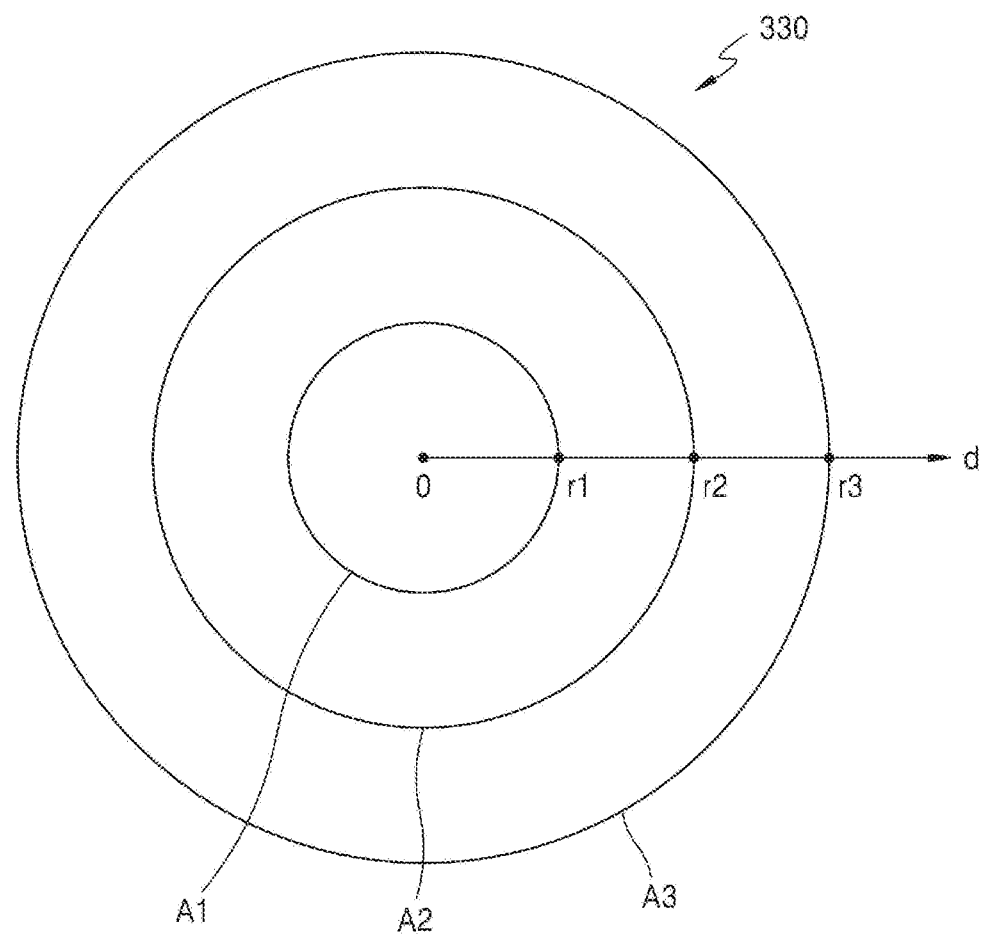
FIG. 12 is a plan view of a planar structure of a nanostructure reflector applicable to a VCSEL according to an example embodiment.

FIG. 12 is a plan view of a planar structure of a nanostructure reflector 330 applicable to a VCSEL according to an example embodiment.

Referring to FIG. 12, the nanostructure reflector 330 may be divided into a plurality of regions A1, A2, and A3 according to a distance d in a direction away from the center. A first region A1 is circular. A second region A2 and a third region A3 has a ring shape. Widths of the plurality of nanostructures that are anisotropic nanoelements in each of the plurality of regions A1, A2, and A3 may increase as a distance away from the center increases. This may be similar to the change of width W described with reference to FIG. 11. Numbers, sizes, arrangement periods, or the like of the plurality of regions A1, A2, and A3 are not limited to those shown in the drawings, but may be changed.

Figure 13:
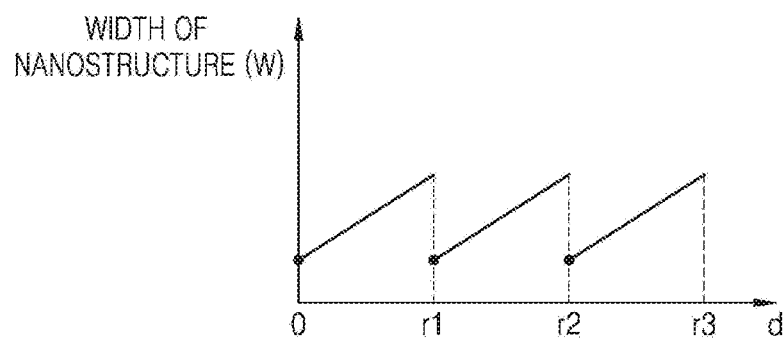
FIG. 13 is a graph exemplarily showing the change of widths of nanostructures in respective regions of the nanostructure reflector shown in FIG. 12.

FIG. 13 is a graph exemplarily showing the change of widths of nanostructures in respective regions of the nanostructure reflector shown in FIG. 12.

Referring to FIG. 13, widths of the nanostructures in each region of the nanostructure reflector may increase as a distance away from a center increases. The width of the nanostructure in the first region A1 in FIG. 12 from the center (d=0) to an r1 position of the nanostructure reflector may gradually increase as the distance away from the center increases. Such change in the widths of the nanostructures may similarly occur in the second region A2 in FIG. 12 between r1 and r2, and the third region A3 in FIG. 12 between r2 and r3.

Figure 14:
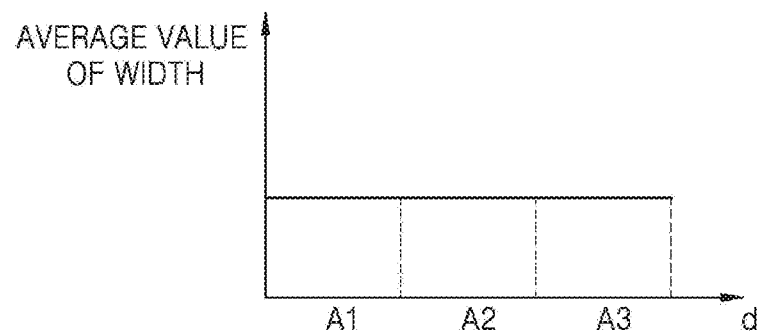
FIG. 14 is a graph showing changes of an average value of a width of nanostructure in a plurality of regions of a nanostructure reflector according to an example embodiment.

An average value of the width W of the nanostructure in the plurality of regions A1, A2, and A3 of the nanostructure reflector 330 may be constant or substantially constant as shown in the graph of FIG. 14.

Referring to FIG. 14, an average value of the width W of the nanostructure in the first region A1 of the nanostructure reflector, an average value of the width W of the nanostructure in the second region A2 of the nanostructure reflector, and an average value of the width W of the nanostructure in the third region A3 of the nanostructure may be the same or substantially similar.

Figure 15:
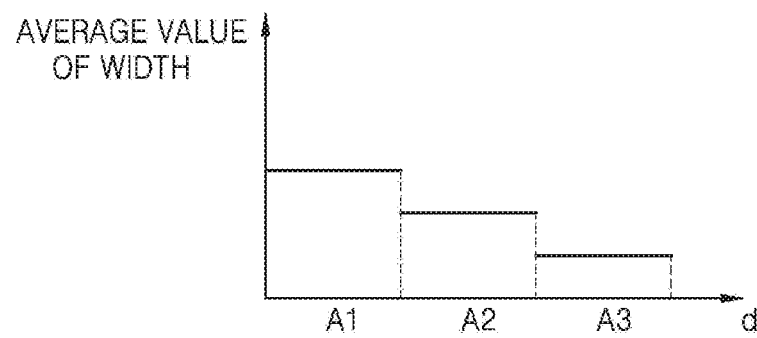
FIG. 15 is a graph showing changes of an average value of a width of nanostructure in a plurality of regions of a nanostructure reflector according to an example embodiment.

According to an example embodiment, the average widths of the nanostructures in the plurality of regions A1, A2, and A3 may be different as shown in the graph of FIG. 15.

Referring to FIG. 15, the average value of the width of the nanostructure in the first region A1, the average value of the width of the nanostructure in the second region A2, and the average value of the width of the nanostructure in the third region A3 may be different from each other. For example, the average value of the width W may decrease from the first region A1 to the second region A2 and the third region A3. However, example embodiments are not limited thereto, and the widths of the nanostructures may be changed as needed.

Figure 16:
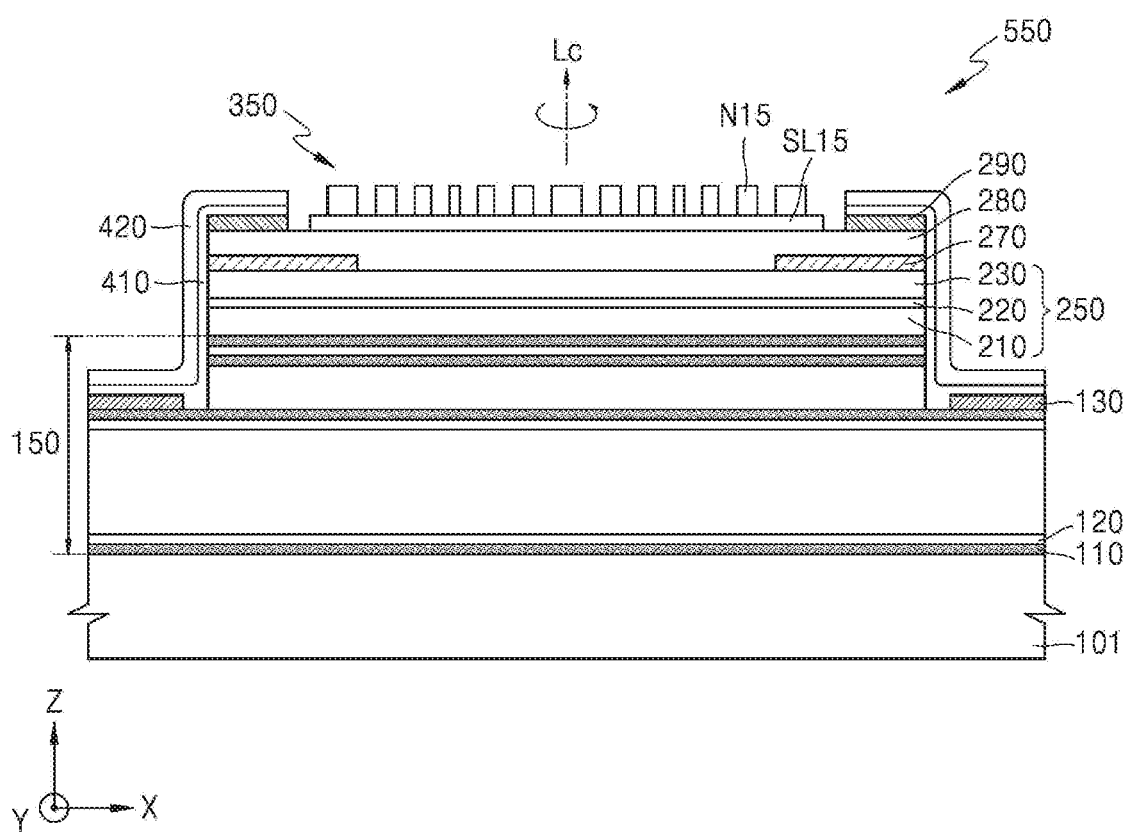
FIG. 16 is a cross-sectional view of a particular structure including a VCSEL including a nanostructure reflector according to an example embodiment.

FIG. 16 is a cross-sectional view of a particular structure including a VCSEL 550 including a nanostructure reflector 350 according to an example embodiment.

Referring to FIG. 16, the VCSEL 550 may include a gain layer 250 generating light, a distributed Bragg reflector 150 arranged on a lower portion of the gain layer 250, and a nanostructure reflector 350 arranged on an upper portion of the gain layer 250.

The gain layer 250 may include an active layer 220 which includes a semiconductor material. The active layer 220 may include, for example, a III-V semiconductor material or a II-VI semiconductor material. As a particular example, the active layer 220 may include an MQW structure including InGaAs, AlGaAs, AlGaN, InGaAsP, InGaP, or AlGaInP. In addition, the active layer 220 may include a quantum dot. A material and a structure of the active layer 220 are not limited to those illustrated and may vary. The gain layer 250 may further include a first clad layer 210 on a lower portion of the active layer 220, and a second clad layer 230 on an upper portion of the active layer 220. The first clad layer 210 and the second clad layer 230 may each include an n-type, a p-type, or an intrinsic semiconductor material. The first clad layer 210 and the second clad layer 230 may include a semiconductor material such as the active layer 220 and further include an n-type dopant or a p-type dopant.

The nanostructure reflector 350 arranged on the upper portion of the gain layer 250 and the distributed Bragg reflector 150 arranged on the lower portion of the gain layer 250 may resonate light generated in the gain layer 250 and amplify the light in a wavelength band to output the light. For example, reflexibilities of the distributed Bragg reflector 150 and the nanostructure reflector 350 may be set to about 90% or more. The reflectance of the distributed Bragg reflector 150 may be made greater than the reflectance of the nanostructure reflector 350. For example, the reflectance of the distributed Bragg reflector 150 may be set to about 98% or more such that light may be emitted through the nanostructure reflector 350. According to example embodiments, the reflexibilities of the distributed Bragg reflector 150 and the nanostructure reflector 350 may be adjusted such that a direction in which light is emitted is reversed.

The distributed Bragg reflector 150 may be formed by alternately and repeatedly stacking a first material layer 110 and a second material layer 120 to a thickness of about ¼ of the desired oscillation wavelength, the first material layer 110 and the second material layer 120 having different refractive indexes from each other. The distributed Bragg reflector 150 may be formed above a semiconductor substrate 101. The reflectance of the distributed Bragg reflector 150 may be set to a desired value by adjusting a refractive index difference between the first material layer 110 and the second material layer 120 and adjusting the number of times of repeatedly stacking the first material layer 110 and the second material layer 120. The distributed Bragg reflector 150 may be formed to include a series of materials which are the same as or similar to the semiconductor material constituting the gain layer 250. For example, the first material layer 110 may be an $Al_xGa_{(1-x)}As$ layer, wherein x is $0 \le x \le 1$, and the second material layer 120 may be an $Al_yGa_{(1-y)}As$ layer, wherein y is $0 \le y \le 1$, $x \ne y$. However, the material layers may not be limited thereto. The distributed Bragg reflector 150 may be doped to be of a same semiconductor type as the first clad layer 210. For example, the first clad layer 210 may be doped an n-type impurity to be n-type. The first clad layer 210 may be doped a p-type impurity to be p-type. The material of the distributed Bragg reflector 150 may not be limited to that described above, and various materials capable of forming a refractive index difference may be used for the first material layer 110 and the second material layer 120.

The nanostructure reflector 350 includes a plurality of nanostructures N15 having a subwavelength shape. Here, the shape dimension of the subwavelength indicates that a thickness or a width, which is a dimension to define a shape of the nanostructure N15, is less than an operating wavelength of the nanostructure reflector 350. The operating wavelength of the nanostructure reflector 350 is within a wavelength band of light generated in the gain layer 250 and indicates light Lc oscillated and emitted between the distributed Bragg reflector 150 and the nanostructure reflector 350 in the light generated in the gain layer 250, the light Lc being the wavelength of the circularly polarized laser light Lc. The wavelength may be an oscillation wavelength $\lambda$.

The plurality of nanostructures N15 may include a material having a refractive index higher than that of a surrounding material, e.g., air, and may reflect light of a predetermined wavelength band by shape dimensions of the subwavelength, particular shapes, and arrangement forms. At least one of a thickness, width, and arrangement pitch of the plurality of nanostructures N15 may be ½ or less of the oscillation wavelength $\lambda$. When a width of the nanostructure N15 is ½ or less of the oscillation wavelength $\lambda$, the nanostructure N15 may operate as a stronger scattering unit having a meta-structure and control an incident light to the desired shape without higher order diffraction as an arrangement interval decreases less than the oscillation wavelength $\lambda$. Although the nanostructure reflector 350 having a high reflection characteristic may operate when a thickness of the nanostructure N15 is ½ or less of the oscillation wavelength $\lambda$, a required thickness is not limited thereto.

The plurality of nanostructures N15 may include a dielectric material or a semiconductor material. For example, the nanostructure N15 may include one of a material of a single crystal silicon (Si), a polycrystalline silicon, an amorphous silicon, $Si_3N_4$, GaP, TiO2, AlSb, AlAs, AlGaAs, AlGaInP, BP, and ZnGeP2. According to an example embodiment, the nanostructure N15 may include a conductive material. As the conductive material, a highly conductive material capable of causing surface plasmon excitation may be used. For example, at least one selected from among Cu, Al, Ni, Fe, Co, Zn, Ti, Ru, Rh, Pd, Pt, Ag, Os, Ir, and Au may be used and an alloy including any one of them may be included. In addition, a conductive two-dimensional material, such as graphene, or a conductive oxide may be used. According to an example embodiment, some of the plurality of nanostructures N15 may include a dielectric material having a high refractive index, and the rest may include a conductive material.

The nanostructure reflector 350 may include a support layer SL15 supporting the plurality of nanostructures N15. The support layer SL15 may include a material having a refractive index that is less than the refractive index of the nanostructure N15. For example, the support layer SL15 may include $SiO_2$, and a transparent conductive oxide (TCO), or a polymer such as a polycarbonate (PC), polystyrene (PS), and polymethyl methacrylate (PMMA). For example, the support layer SL15 may include $SiO_2$, and a TCO, or a polymer such as a PC, PS, and PMMA. The support layer SL15 and the nanostructure N15 may include a same or similar semiconductor material. The support layer SL15 and the nanostructure N15 may include a same or similar semiconductor material. Further, by controlling a composition ratio of the compound, the refractive index of the support layer SL15 may be made less than the refractive index of the nanostructure N15. A refractive index difference between the support layer SL15 and the nanostructure N15 may be about 0.5 or more.

A thickness of the support layer SL15 may be set to about ⅕ or more of the oscillation wavelength $\lambda$. When the thickness of support layer SL15 is less than ⅕ of the oscillation wavelength $\lambda$, light resonating in the nanostructure N10 on the support layer SL15 may be coupled to a lower layer formed of the semiconductor material, and thus the desired operation may not be performed as a meta-structure.

The VCSEL 550 may further include an aperture layer 270 configured to adjust a mode of emitted light or a beam size. The aperture layer 270 may include a predetermined oxide. In FIG. 16, the aperture layer 270 is illustrated as being formed above the gain layer 250, but is not limited thereto. For example, the aperture layer 270 may be arranged in the distributed Bragg reflector 150. In addition, the aperture layer 270 may be provided in plurality or may be omitted. An inserted layer 280 in contact with the gain layer 250 may be further included above the aperture layer 270. The inserted layer 280 may include a same series or a similar series of a semiconductor material as the gain layer 250. The inserted layer 280 may be doped with a desired impurity.

The VCSEL 550 may further include a first electrode 130 and a second electrode 290 spaced apart by the gain layer 250 to inject a current into the gain layer 250. The first electrode 130 may be arranged to be electrically connected to the first surface of the gain layer 250 and the second electrode 290 may be arranged to be electrically connected to a second surface of the gain layer 250. A portion of the distributed Bragg reflector 150 may be etched to a mesa-type as shown in FIG. 16, and the first electrode 130 may be arranged on an upper surface of the distributed Bragg reflector 150 exposed by etching. The second electrode 290 may be arranged at an edge portion of the inserted layer 280 and be electrically connected to the gain layer 250 through the inserted layer 280. However, arrangements of the first electrode 130 and the second electrode 290 shown here are an example and may be variously changed. For example, the first electrode 130 may be formed on the lower surface of the distributed Bragg reflector 150 or on a lower surface of a substrate 101.

The VCSEL 550 may further include a heat sink 420 configured to emit heat generated in the gain layer 250. The heat sink 420 may include a metal material having excellent thermal conductivity, for example, Cu, Au, and Al, or the like, but is not limited thereto. The heat sink 420 may be formed to surround the VCSEL 550. For example, as shown in FIG. 16, the heat sink 420 may be formed to extend from an upper surface of a position excluding a region where light is emitted, alongside surfaces and in a stacking direction of the distributed Bragg reflector 150 and the gain layer 250. An insulating layer 410 may be provided between the heat sink 420 and the first electrode 130, the side surfaces and the second electrode 290. In addition, the heat generated in the gain layer 250 may be released to the outside through the heat sink 420.

Since an interval between the gain layer 250 and the first electrode 130 is short, heat may be easily released through the heat sink 420 through the first electrode 130. Since the nanostructure reflector 350, which is thin and compact, is used instead of using a distributed Bragg reflector (DBR) mirror on the upper surface of the gain layer 250, the interval between the gain layer 250 and the first electrode 130 may be shortened and the heat may be more easily released through an upper surface portion of the VCSEL 550. In addition, the heat may be easily released through the heat sink 420 in a lateral direction of the gain layer 250. As described above, since the VCSEL 550 of the present disclosure uses the nanostructure reflector 350 which may be realized with a smaller thickness as a reflector allowing light in a particular wavelength band to be emitted in light generated in the gain layer 250, a size of a device may be miniaturized and heat release may be more efficiently performed.

In addition, as described above, the VCSEL 550 may emit circularly polarized laser light Lc through the nanostructure reflector 350 by distributions and arrangement directions of the plurality of nanostructures N10 constituting the nanostructure reflector 350. According to example embodiments, the nanostructure reflector 350 may optically have a concave mirror or similar optical characteristics with respect to the gain layer 250 and may enhance an intensity of the circularly polarized laser light Lc emitted or control a wavefront profile of the circularly polarized laser light Lc.

Figure 17:
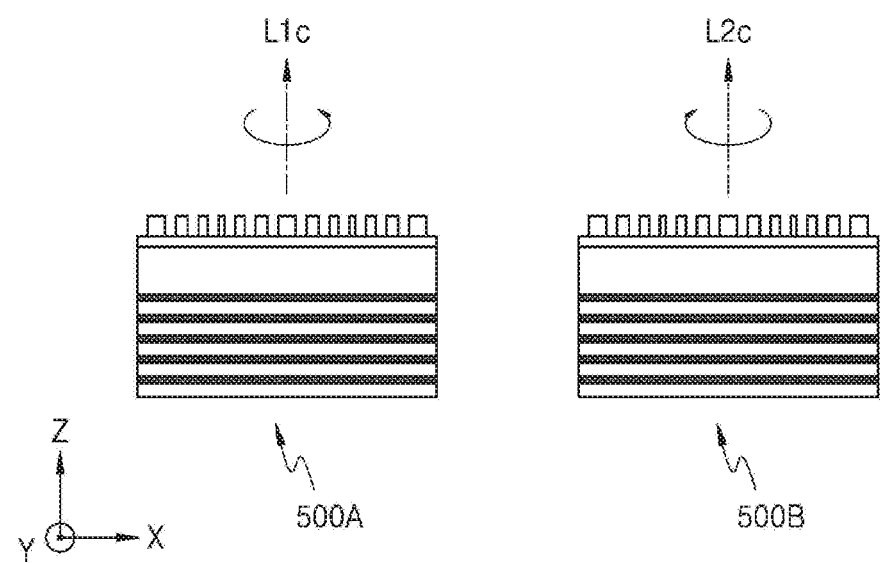
FIG. 17 is a cross-sectional view of a plurality of VCSELs applicable to an optical apparatus according to an example embodiment.

FIG. 17 is a cross-sectional view of a plurality of VCSELs applicable to an optical apparatus according to an example embodiment.

Referring to FIG. 17, the optical apparatus may include a plurality of VCSELs 500A and 500B. The plurality of VCSELs 500A and 500B may include a first VCSEL 500A and a second VCSEL 500B. The first VCSEL 500A may emit, for example, a left-handed circularly polarized laser light L1c, and the second VCSEL 500B may emit, for example, a right-handed circularly polarized laser light L2c. The first VCSEL 500A and the second VCSEL 500B may include a nanostructure reflector described with reference to FIG. 1 or the like, and may determine a direction of circularly polarized light according to directions and arrangement directions of a plurality of nanostructures that are anisotropic nanoelements constituting the nanostructure reflector. The optical apparatus including the first VCSEL 500A and the second VCSEL 500B may be used to, for example, a three-dimensional imaging device, a three-dimensional projector, a three-dimensional sensor, a depth sensor, and other various devices.

Figure 18:
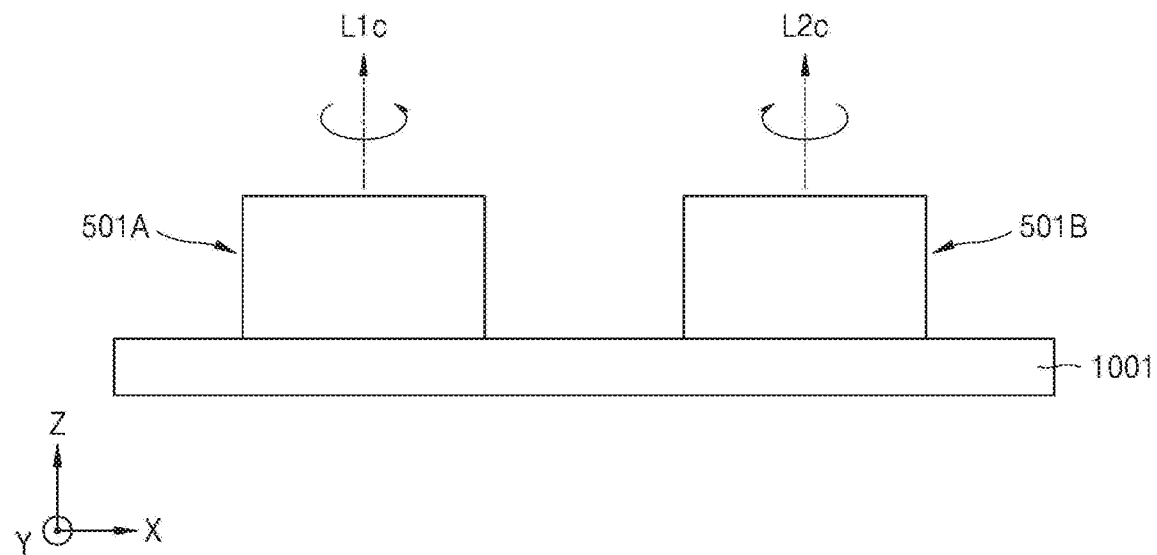
FIG. 18 is a cross-sectional view of a plurality of VCSELs applicable to an optical apparatus according to an example embodiment.

The first VCSEL 500A and the second VCSEL 500B may be separately fabricated on different substrates or may be fabricated together on a same substrate. FIG. 18 shows an example embodiment where two types of lasers 501A and 502B are formed on a same substrate 1001.

Referring to FIG. 18, a first VCSEL 501A and a second VCSEL 501B may be included on one substrate 1001. The first VCSEL 501A may emit, for example, a left-handed circularly polarized laser light L1c, and the second VCSEL 501B may emit, for example, a right-handed circularly polarized laser light L2c.

Figure 19:
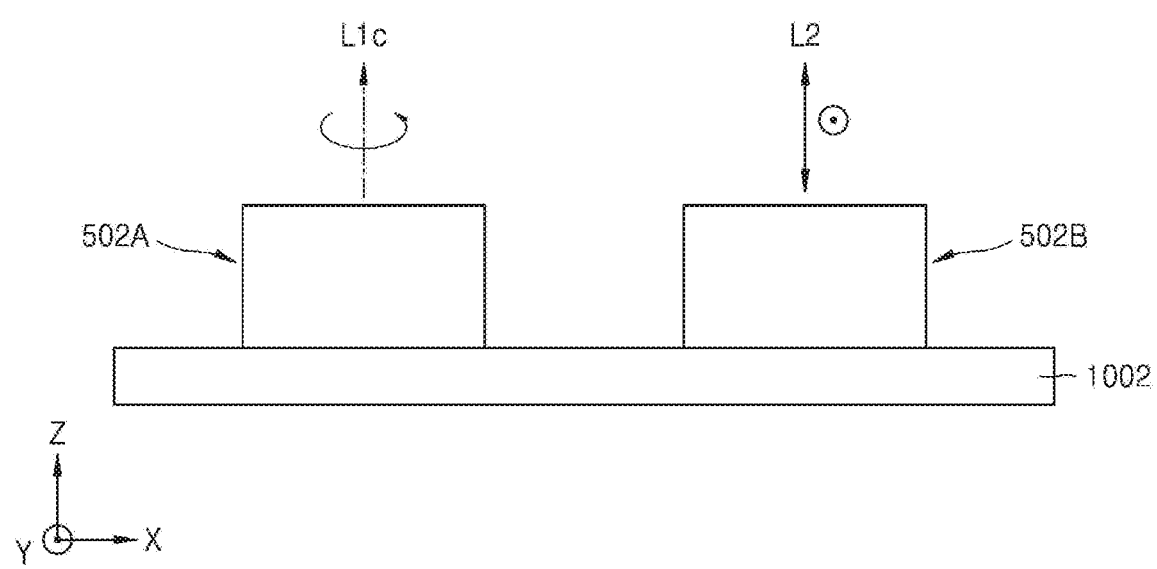
FIG. 19 is a sectional view of a plurality of VCSELs applicable to an optical apparatus according to an example embodiment.

In FIG. 18, either one of the two lasers 501A and 501B may be configured to emit a linear polarized light instead of the circularly polarized light as shown in FIG. 19.

Referring to FIG. 19, a first VCSEL 502A and a second VCSEL 502B may be included on a substrate 1002. The first VCSEL 502A may emit, for example, a left-handed circularly polarized laser light L1c, and the second VCSEL 502B may emit, for example, a linear polarized laser light L2. Although the circularly polarized laser light L1c is shown as a left-handed circularly polarized light, the circularly polarized laser light L1c may be a right-handed circularly polarized light. The linear polarized laser light L2 may be a linearly polarized laser light in a direction parallel to a Z-axis, or a linearly polarized laser light in a horizontal direction in an XY plane. The first VCSEL 502A may include a nanostructure reflector as described with reference to FIG. 1 or the like. The second VCSEL 502B may include a nanostructure reflector having a different structure from the nanostructure reflector of the first VCSEL 502A.

Figure 20:
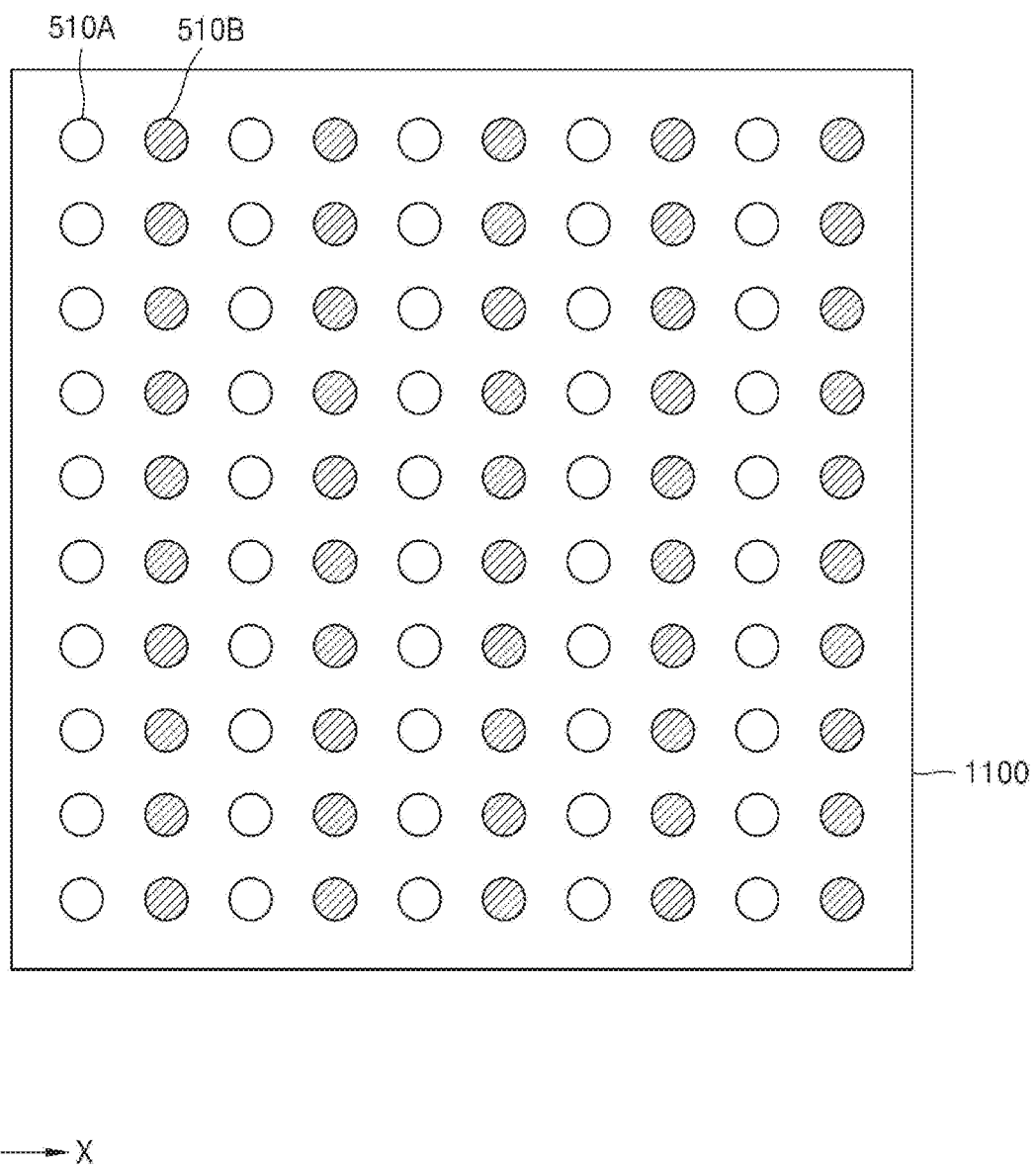
FIG. 20 is a plan view of a light source unit including a laser array according to an example embodiment.
Figure 21:
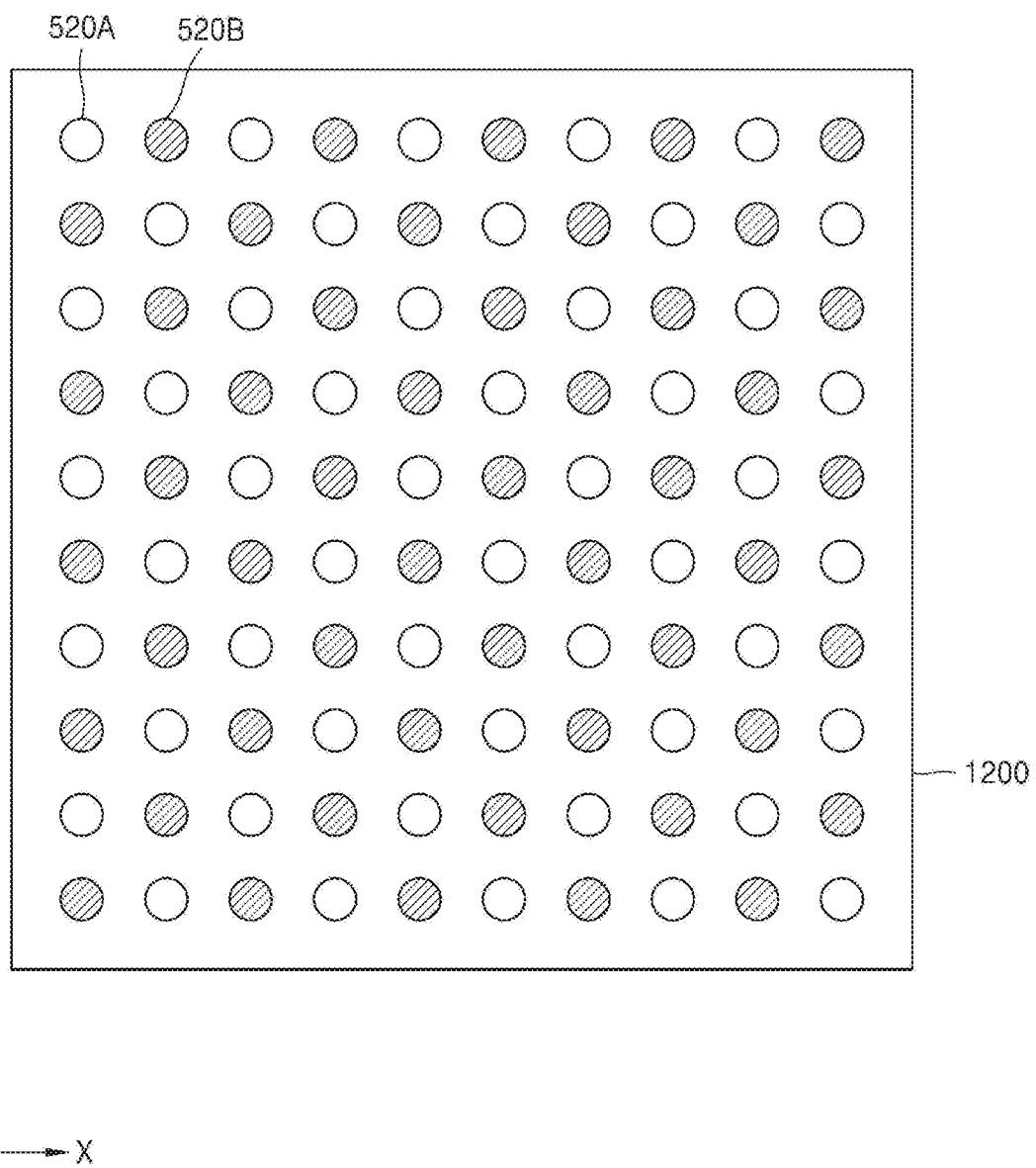
FIG. 21 is a plan view of a light source unit including a laser array according to an example embodiment.

According to an example embodiment, at least two types of lasers may be provided in an array on one substrate as shown in FIGS. 20 and 21.

FIG. 20 is a plan view of a light source unit including a laser array according to an example embodiment.

Referring to FIG. 20, a plurality of first VCSELs 510A and a plurality of second VCSELs 510B may be arranged on a substrate 1100 in an array. The plurality of VCSELs 510A may be arranged to form a plurality of columns, and the plurality of VCSELs 510B may be arranged to form a plurality of columns. Columns constituted by the first VCSEL 510A and columns constituted by the second VCSEL 510B may be alternately arranged.

The plurality of first VCSELs 510A and the plurality of second VCSELs 510B may be controlled independently of each other. Therefore, only the plurality of first VCSELs 510A may operate to emit light while the plurality of second VCSELs 510B do not emit light or only the plurality of second VCSELs 510B may operate to emit light while the plurality of first VCSELs 510A do not emit light. The plurality of first VCSELs 510A may emit a circularly polarized laser light in a first direction, and the plurality of second VCSELs may emit a circularly polarized laser light in a second direction or emit a linear polarized laser light. According to example embodiments, at least a portion of the plurality of first VCSELs 510A and at least a portion of the plurality of second VCSELs 510B may be simultaneously driven. In addition, arrays of the plurality of first VCSELs 510A and the plurality of second VCSELs 510B may be possible to be sequentially driven by a scanning method or may be driven in different forms.

FIG. 21 is a plan view of a light source unit including a laser array according to an example embodiment.

Referring to FIG. 21, a plurality of first VCSELs 520A and a plurality of second VCSELs 520B may be arranged on a substrate 1200 in an array. The plurality of first VCSELs 520A and the plurality of second VCSELs 520B may be arranged to form a plurality of columns and a plurality of rows, wherein the first VCSEL 520A and the second VCSEL 520B may be alternately arranged in each column. Also, the first VCSEL 520A and the second VCSEL 520B may be alternately arranged in each row. The plurality of first VCSEL 520A may emit a circularly polarized laser light in a first direction and the plurality of second VCSEL 520B may emit a circularly polarized laser light in a second direction or a linear polarized laser light. Array methods shown in FIGS. 20 and 21 are examples and may be varied in various ways.

Although the VCSELs 510A, 510B, 520A, and 520B are shown as circular as viewed from above in FIGS. 20 and 21, this is only an example and planar structures of the VCSELs 510A, 510B, 520A, and 520B may be different. For example, planar structures on the XY plane of a portion of the VCSELs 510A, 510B, 520A, and 520B may be a rectangular, an oval, or similar anisotropic or asymmetric structure, and optical properties may be controlled.

While example embodiments have been described with reference to the figures, it will be understood by those of ordinary skill in the art that various changes in form and details may be made therein without departing from the spirit and scope as defined by the following claims.

What is claimed is:

1. A vertical cavity surface-emitting laser comprising:
a gain layer configured to generate light;
a distributed Bragg reflector disposed on a first surface of the gain layer; and
a nanostructure reflector disposed on a second surface of the gain layer opposite from the first surface, the nanostructure reflector comprising a plurality of nanostructures having a sub-wavelength dimension,
wherein the plurality of nanostructures comprise a plurality of anisotropic nanoelements and are configured to emit a circularly polarized laser light through the nanostructure reflector based on distributions and arrangement directions of the plurality of anisotropic nanoelements,
wherein the plurality of anisotropic nanoelements are disposed two-dimensionally,
wherein an arrangement direction of each of the plurality of anisotropic nanoelements changes from a central portion of the nanostructure reflector to an edge of the nanostructure reflector two-dimensionally,
wherein the nanostructure reflector further comprises a support layer disposed between the plurality of anisotropic nanoelements and the gain layer,
wherein the support layer is provided directly on an entire surface of the gain layer,
wherein a refractive index of the support layer is lower than a refractive index of the plurality of anisotropic nanoelements, and
wherein a width of the plurality of anisotropic nanoelements increases as a distance from the central portion of the nanostructure reflector increases in a radial direction.

2. The vertical cavity surface-emitting laser of claim 1, wherein the plurality of nanostructures are further configured to emit a right-handed circularly polarized laser light or a left-handed circularly polarized laser light based on the distributions and the arrangement directions of the plurality of anisotropic nanoelements.

3. The vertical cavity surface-emitting laser of claim 1, wherein the plurality of anisotropic nanoelements have a thickness of ½ or less of an oscillation wavelength λ of the circularly polarized laser light.

4. The vertical cavity surface-emitting laser of claim 1, wherein the plurality of anisotropic nanoelements have an arrangement interval of ½ or less of an oscillation wavelength λ of the circularly polarized laser light.

5. The vertical cavity surface-emitting laser of claim 1, wherein a size distribution and an arrangement rule of the plurality of anisotropic nanoelements are determined such that the nanostructure reflector is configured to act as a concave mirror with respect to the gain layer.

6. The vertical cavity surface-emitting laser of claim 5, wherein the nanostructure reflector comprises a plurality of regions based on a distance in the radial direction away from the central portion of the nanostructure reflector, and
the width of the plurality of anisotropic nanoelements included in each of the plurality of regions increases in the radial direction as the distance from the central portion of the nanostructure reflector increases.

7. The vertical cavity surface-emitting laser of claim 6, wherein an average value of widths of the plurality of anisotropic nanoelements included in each of the plurality of regions are equal.

8. The vertical cavity surface-emitting laser of claim 5, wherein the nanostructure reflector is divided into a plurality of regions based on a distance in a radial direction away from the central portion of the nanostructure reflector,
wherein the plurality of regions comprise a first region and a second region, and
wherein an average value of widths of the plurality of anisotropic nanoelements included in the first region and an average value of widths of the plurality of anisotropic nanoelements included in the second region are different from each other.

9. The vertical cavity surface-emitting laser of claim 1, wherein the support layer has a thickness of ⅕ or more of an oscillation wavelength λ of the circularly polarized laser light.

10. The vertical cavity surface-emitting laser of claim 1, wherein a reflectance of the distributed Bragg reflector is greater than a reflectance of the nanostructure reflector.

11. The vertical cavity surface-emitting laser of claim 1, wherein the gain layer comprises a first clad layer, a second clad layer, and an active layer disposed between the first clad layer and the second clad layer.

12. The vertical cavity surface-emitting laser of claim 11, wherein at least one of the active layer, the first clad layer, and the second clad layer comprises a III-V semiconductor material or a II-VI semiconductor material.

13. An optical apparatus comprising:
a vertical cavity surface-emitting laser comprising:
a gain layer configured to generate light;
a distributed Bragg reflector disposed on a first surface of the gain layer; and
a nanostructure reflector disposed on a second surface of the gain layer opposite from the first surface, the nanostructure reflector comprising a plurality of nanostructures having a sub-wavelength dimension,
wherein the plurality of nanostructures comprise a plurality of anisotropic nanoelements and are configured to emit a circularly polarized laser light through the nanostructure reflector based on distributions and arrangement directions of the plurality of anisotropic nanoelements,
wherein the plurality of anisotropic nanoelements are disposed two-dimensionally,
wherein an arrangement direction of each of the plurality of anisotropic nanoelements changes from a central portion of the nanostructure reflector to an edge of the nanostructure reflector two-dimensionally,
wherein the nanostructure reflector further comprises a support layer disposed between the plurality of anisotropic nanoelements and the gain layer,
wherein the support layer is provided directly on an entire surface of the gain layer,
wherein a refractive index of the support layer is lower than a refractive index of the plurality of anisotropic nanoelements, and
wherein a width of the plurality of anisotropic nanoelements increases as a distance from the central portion of the nanostructure reflector increases in a radial direction.

14. The optical apparatus of claim 13, further comprising a first vertical cavity surface-emitting laser and a second vertical cavity surface-emitting laser,
wherein the first vertical cavity surface-emitting laser comprises a plurality of first nanostructures having a first arrangement and is configured to emit a first circularly polarized laser light, and
the second vertical cavity surface-emitting laser comprises a plurality of second nanostructures having a second arrangement and is configured to emit a second circularly polarized laser light.

15. The optical apparatus of claim 14, wherein one of the first circularly polarized laser light and the second circularly polarized laser light is a right-handed circularly polarized laser light, and the other is a left-handed circularly polarized laser light.

16. The optical apparatus of claim 14, further comprising:
an array of a plurality of first vertical cavity surface-emitting lasers and a plurality of second vertical cavity surface-emitting lasers.

17. The optical apparatus of claim 13, further comprising:
at least one of a three-dimensional imaging apparatus, a three-dimensional projector, a three-dimensional sensor, and a depth sensor.

* * * * *